(12) United States Patent
Lee

(10) Patent No.: US 10,090,183 B2
(45) Date of Patent: Oct. 2, 2018

(54) SAMPLE HOLDER

(71) Applicant: KYOCERA Corporation, Kyoto-shi, Kyoto (JP)

(72) Inventor: Sangkee Lee, Cheonan (KR)

(73) Assignee: Kyocera Corporation, Kyoto (JP)

(*) Notice: Subject to any disclaimer, the term of this patent is extended or adjusted under 35 U.S.C. 154(b) by 396 days.

(21) Appl. No.: 14/786,716

(22) PCT Filed: Apr. 25, 2014

(86) PCT No.: PCT/JP2014/061696
§ 371 (c)(1),
(2) Date: Oct. 23, 2015

(87) PCT Pub. No.: WO2014/175425
PCT Pub. Date: Oct. 30, 2014

(65) Prior Publication Data
US 2016/0155655 A1 Jun. 2, 2016

(30) Foreign Application Priority Data
Apr. 26, 2013 (JP) ................... 2013-094340

(51) Int. Cl.
*H01L 21/683* (2006.01)
*H01L 21/687* (2006.01)

(52) U.S. Cl.
CPC .... *H01L 21/6833* (2013.01); *H01L 21/68757* (2013.01); *H01L 21/6831* (2013.01)

(58) Field of Classification Search
CPC ............ H01L 21/6833; H01L 21/6831; H01L 21/68757
See application file for complete search history.

(56) References Cited

U.S. PATENT DOCUMENTS

2006/0102613 A1* 5/2006 Kuibira ............ H01L 21/67103
219/444.1

FOREIGN PATENT DOCUMENTS

| JP | 07-130826 A | 5/1995 |
| JP | 07326655 A | * 12/1995 |
| JP | 2013-010676 A | 1/2013 |

OTHER PUBLICATIONS

International Search Report (Form PCT/ISA/210) dated Jul. 22, 2014 and issued for International Patent Application No. PCT/JP2014/061696.
Japanese Office Action with English concise explanation, Japanese Patent Application No. 2015-513849, dated Aug. 2, 2016, 4 pgs.

* cited by examiner

*Primary Examiner* — Scott Bauer
(74) *Attorney, Agent, or Firm* — Volpe and Koenig, P.C.

(57) ABSTRACT

A sample holder includes a substrate which is formed of a ceramic containing aluminum nitride as a primary component and which has an outer surface functioning as a sample holding surface and an electrical conductor which is provided in the substrate and which faces the sample holding surface. In this sample holder, at the sample holding surface side in the substrate than the electrical conductor, the oxygen content of the ceramic is small in a region located inside the periphery of the electrical conductor as compared to that in a region located outside the periphery thereof.

9 Claims, 2 Drawing Sheets

SAMPLE HOLDER

TECHNICAL FIELD

The present invention relates to a sample holder used for, for example, a film forming apparatus.

BACKGROUND ART

In a process for manufacturing semiconductor integrated circuits or the like, a film forming apparatus has been used. In this film forming apparatus, for example, a sample holder is used as a component which holds each sample, such as a semiconductor wafer. As the sample holder, for example, an electrostatic chuck disclosed in Japanese Unexamined Patent Application Publication No. 7-130826 (hereinafter referred to as "Patent Document 1") may be mentioned. The electrostatic chuck disclosed in Patent Document 1 includes a ceramic substrate and an electrode provided therein. This electrostatic chuck mounts an object to be heated on a main surface of the ceramic substrate.

However, in the electrostatic chuck disclosed in Patent Document 1, when a high frequency alternating current is allowed to pass through the electrode, since the electrode generates heat, molecules in the ceramic substrate may react with oxygen contained therein in some cases. Accordingly, the dielectric tangent may be partially increased in the ceramic substrate. As a result, the thermal uniformity of the main surface of the ceramic substrate may be degraded in some cases.

SUMMARY OF INVENTION

A sample holder according to one aspect of the present invention comprises a substrate which is formed of a ceramic containing aluminum nitride as a primary component and which has an outer surface functioning as a sample holding surface and an electrical conductor which is provided in the substrate and which faces the sample holding surface, and at the sample holder surface side in the substrate than the electrical conductor, the oxygen content of the ceramic is small in a region located inside the periphery of the electrical conductor as compared to that in a region located outside the periphery thereof.

DESCRIPTION OF EMBODIMENTS

Hereinafter, a sample holder 10 according to one embodiment of the present invention will be described.

Figure 1:
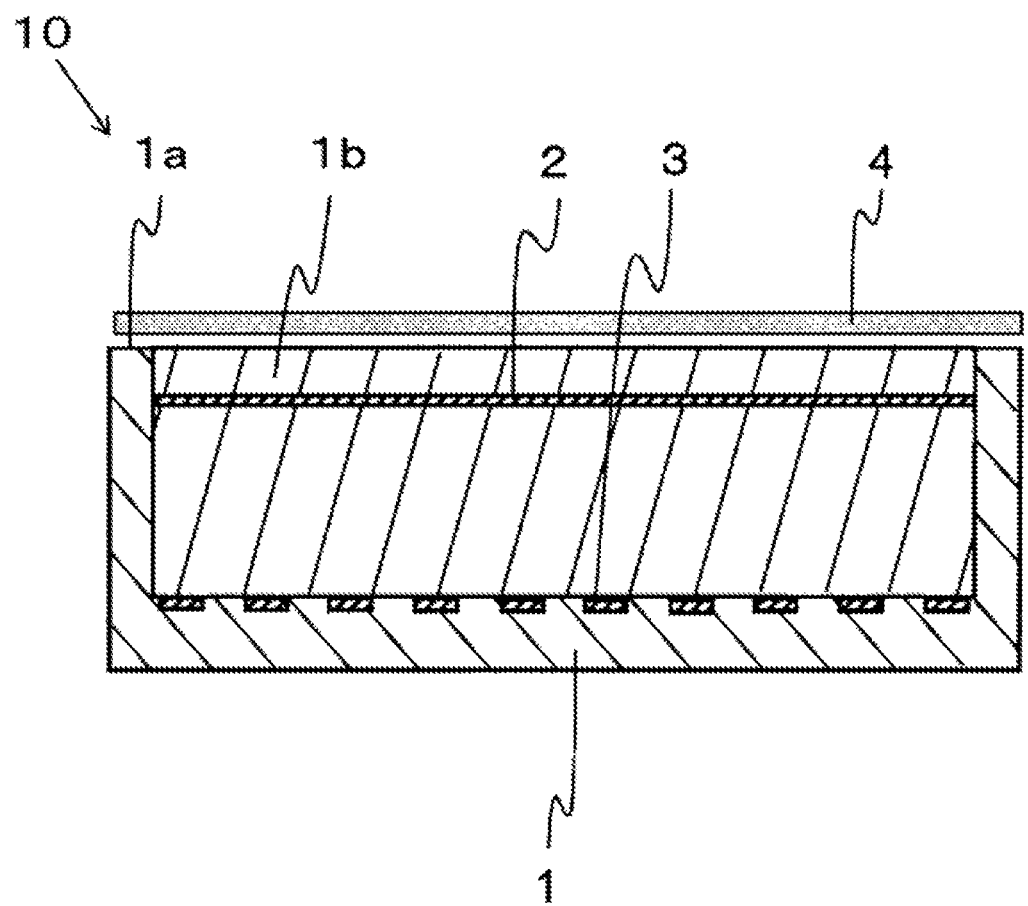
FIG. 1 is a cross-sectional view showing a sample holder which is one example of an embodiment of the present invention.

FIG. 1 is a cross-sectional view showing the sample holder 10 which is one example of the embodiment of the present invention. As shown in FIG. 1, the sample holder 10 includes a substrate 1 and an electrical conductor provided therein. In this embodiment, the electrical conductor is a heat generating resistor 3. In addition, the substrate 1 further includes an electrostatic adsorbing electrode 2. The sample holder 10 is used in a process for manufacturing semiconductor integrated circuit devices, a process for manufacturing liquid crystal display devices, or the like. The sample holder 10 is, for example, a member which holds a sample (hereinafter also referred to as "object 4 to be adsorbed" in some cases) such as a semiconductor wafer.

The substrate 1 is a plate-shaped member having an upper surface functioning as a sample holding surface 1a. The sample holder 10 holds the object 4 to be adsorbed on the sample holding surface 1a of the substrate 1. The substrate 1 is a member having a circular shape in plan view. The substrate 1 is formed of a ceramic containing aluminum nitride as a primary component. The dimensions of the substrate 1 may be set, for example, to have a diameter of 200 to 500 mm and a thickness of 2 to 15 mm. The sample holding surface 1a of the substrate 1 may be formed to have a gas groove or an embossed shape, if needed.

As a method for holding a sample, which is the object 4 to be adsorbed, various methods may be used. According to the sample holder 10 of this embodiment, the sample is held by an electrostatic force. Hence, the sample holder 10 has the electrostatic adsorbing electrode 2 in the substrate 1.

The electrostatic adsorbing electrode 2 is a member to generate an electrostatic force between the electrode 2 and the object 4 to be adsorbed. The electrostatic adsorbing electrode 2 is provided in the sample holder 10. The electrostatic adsorbing electrode 2 is formed of a high melting point metal, such as molybdenum (Mo) or tungsten (W). The electrostatic adsorbing electrode 2 is formed of a bulk metal having a mesh or a plate shape or is formed by firing a metal paste. When being formed of a bulk metal, the electrostatic adsorbing electrode 2 may also be used as a high frequency electrode for high frequency sputtering or plasma CVD.

The electrostatic adsorbing electrode 2 is a so-called bipolar electrode having two separate electrodes. Alternatively, the electrostatic adsorbing electrode 2 may also be a so-called monopolar electrode having only one electrode. In addition, the electrostatic adsorbing electrode 2 may also have at least three electrodes. In addition, as a type of holding the object 4 to be adsorbed, for example, a type of using a coulomb force and a type of using a Johnson-Rahbek force may be used. In this case, since a ceramic material of the substrate 1 contains aluminum nitride as a primary component, charge removal can be easily performed by removal of a residual charge, and an adsorbing force required as the sample holder 10 can also be easily obtained.

The heat generating resistor 3 is a member to heat the object 4 to be adsorbed which is held on the sample holding surface 1a of the substrate 1. The heat generating resistor 3 is provided in the substrate 1. When the sample holding surface 1a is regarded as an upper surface, the heat generating resistor 3 is provided at a side lower than the electrostatic adsorbing electrode 2. In other words, the electrostatic adsorbing electrode 2 is provided at a sample holding surface 1a side than the heat generating resistor 3. Alternatively, the heat generating resistor 3 may be provided on the bottom surface of the substrate 1.

When a current is allowed to pass through the heat generating resistor 3 by applying a voltage thereto, the heat generating resistor 3 can generate heat. The heat generated by the heat generating resistor 3 reaches the sample holding surface 1a, which is the upper surface of the substrate 1, through the inside of the substrate 1. Accordingly, the object 4 to be adsorbed mounted on the sample holding surface 1a can be heated. The heat generating resistor 3 has a linear pattern having a plurality of curved portions. The heat generating resistor 3 is formed along an entire inside plane in the substrate 1. Hence, the thermal distribution can be suppressed from being varied at the sample holding surface 1a. The heat generating resistor 3 is formed, for example, of a metal material, such as W or Mo.

For temperature control of the sample holder 10, the following method may be used. In particular, when a thermal electromotive force of a thermocouple is measured by bringing the thermocouple into contact with the substrate 1, the temperature of the substrate 1 heated by the heat generating resistor 3 can be measured. Based on the temperature of the substrate 1 measured as described above, the voltage to be applied to the heat generating resistor 3 is adjusted. Accordingly, the temperature of the sample holding surface 1a of the substrate 1 can be controlled at a constant value.

In the sample holder 10 of this embodiment, at the sample holding surface 1a side in the substrate 1 than the heat generating resistor 3, the oxygen content of the ceramic in the substrate 1 is small in a region (hereinafter referred to as "low oxygen region 1b") located inside the periphery of the heat generating resistor 3 as compared to that in a region located outside the periphery thereof. Since the substrate 1 has the low oxygen region 1b at the sample holding surface 1a side than the heat generating resistor 3, in the region at the sample holding surface 1a side than the heat generating resistor 3, the probability of reaction between the molecules in the substrate 1 and oxygen contained therein can be reduced. Accordingly, in the region located at the sample holding surface 1a side than the heat generating resistor 3 and inside the periphery of the heat generating resistor 3 than outside the periphery thereof, the dielectric tangent of the substrate 1 can be suppressed from being partially increased. As a result, since unexpected heat generation can be suppressed in the substrate 1, in the region of the sample holding surface 1a located over the electrical conductor, the temperature control can be easily performed.

In addition, in general, when the electrostatic adsorbing electrode 2 is used as a high frequency electrode for high frequency sputtering or plasma CVD, molecules in the ceramic located around the electrostatic adsorbing electrode 2 tends to be unstable due to plasma. However, since the sample holder 10 of this embodiment has the low oxygen region 1b around the electrostatic adsorbing electrode 2, even when the molecules in the ceramic are unstable under an environment in which plasma is generated, the probability of reaction between those molecules and oxygen contained in the ceramic can be reduced. Accordingly, since the dielectric tangent can be suppressed from being partially changed, the uniformity of plasma to be generated can be maintained. As a result, the variation in thickness after film formation can be suppressed from being generated.

The presence of the low oxygen region 1b can be confirmed, for example, by the following method. In particular, after the substrate 1 is cut into parts, a part which is desired to be measured is crushed into a powder using a mortar formed of a non-oxide material. An oxygen amount measurement of the powder thus obtained is performed using an oxygen/nitrogen/hydrogen analyzer (EMGA-930) manufactured by HORIBA. For example, at the sample holding surface 1a side in the substrate 1 than the heat generating resistor 3, when the oxygen content of the ceramic in the substrate 1 in the region located inside the periphery of the heat generating resistor 3 is smaller by 10% or more than that in the region located outside the periphery thereof, it is regarded that the oxygen content is small.

Furthermore, the electrostatic adsorbing electrode 2 is preferably provided in the low oxygen region 1b. As described above, the low oxygen region 1b suppresses the dielectric tangent of the substrate 1 from being increased. Accordingly, the heat generation caused by the flow of a high frequency alternating current through the electrostatic adsorbing electrode 2 can be suppressed.

Furthermore, the oxygen content of the ceramic in the low oxygen region 1b is preferably increased from the electrostatic adsorbing electrode 2 along a direction opposite thereto. Hence, the stress caused by the difference in thermal expansion between the electrostatic adsorbing electrode 2 and the substrate 1 can be made unlikely to be generated. As a result, long-term reliability of the sample holder 10 can be improved.

In addition, in the low oxygen region 1b, the grain diameter of a ceramic in the vicinity of the electrostatic adsorbing electrode 2 is preferably larger than that of a ceramic located at the sample holding surface 1a. Since the interfaces between the grains of the ceramic can be reduced as the grain diameter thereof is increased, the thermal conduction can be preferably performed. Accordingly, the heat generated around the electrostatic adsorbing electrode 2 when a high frequency alternating current is applied thereto can be preferably dispersed in the substrate 1. Furthermore, when the grain diameter of the ceramic at the sample holding surface 1a is decreased, the strength thereof can be improved. The reason for this is as described below.

When a force is applied to the sample holding surface 1a from the outside of the substrate 1, a crack may be generated in the sample holding surface 1a; however, when the crack generated in this surface is very small, propagation of the crack is stopped at grain boundaries, and the force thus applied is also dispersed through the grain boundaries. That is, the length of a very small crack is proportional to the size of the grain diameter of the ceramic. Hence, when the grain diameter of the ceramic at the sample holding surface 1a is decreased, the probability of damaging the sample holding surface 1a can be reduced.

Figure 2:
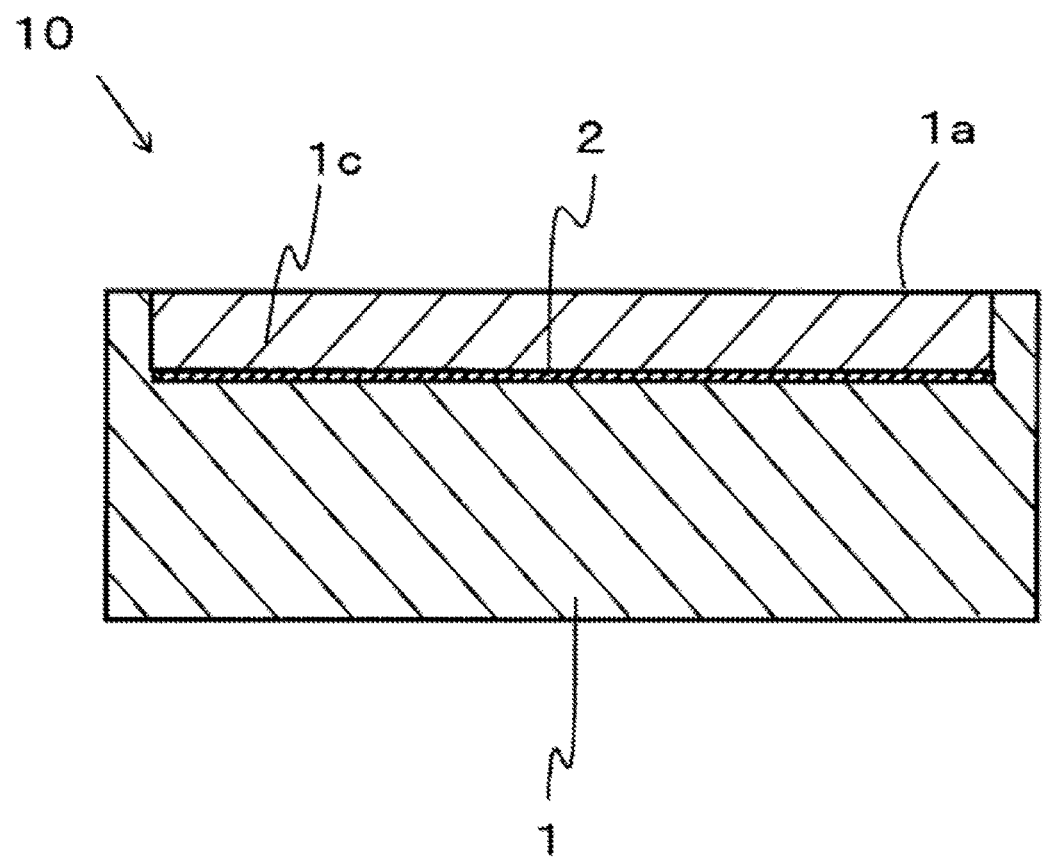
FIG. 2 is a cross-sectional view showing a modified example 1 of the sample holder which is one example of the embodiment of the present invention.

In addition, in the sample holder 10 of this embodiment, although the electrical conductor is the heat generating resistor 3, the electrical conductor is not limited thereto. In particular, as shown in FIG. 2, the sample holder 10 may include the electrostatic adsorbing electrode 2 as the electrical conductor without using the heat generating resistor 3. In the sample holder 10, at the sample holding surface 1a side than the electrostatic adsorbing electrode 2, the oxygen content of the ceramic in the substrate 1 in a region (hereinafter referred to as "low oxygen region 1c") located inside the periphery of the electrostatic adsorbing electrode 2 is small as compared to that in a region located outside the periphery thereof. As described above, in the low oxygen region 1c, the dielectric tangent is suppressed from being increased. Hence, heat generation caused by the flow of a high frequency alternating current through the electrostatic adsorbing electrode 2 can be suppressed.

Hereinafter, a method for manufacturing the sample holder 10 of the present invention will be described. First, an aluminum nitride powder as a primary raw material and a sintering auxiliary agent in a minute amount are charged into a ball mill lined with a resin, such as a urethane or a nylon, and are then mixed and pulverized for 24 to 72 hours in a wet state together with a solvent, such as ion exchanged water or an organic solvent, and balls formed of a metal or a ceramic.

To a raw material slurry obtained by mixing and pulverizing as described above, an organic binder, such as a poly(vinyl alcohol), a poly(vinyl butyral), or an acrylic resin, a plasticizer, and a defoaming agent are added, and mixing is further performed for 24 to 48 hours. An organic-inorganic mixed slurry thus obtained is molded into ceramic green sheets having a thickness of 20 μm to 20 mm by a doctor blade method, a calendar roll method, a press molding method, an extrusion molding method, or the like. In this step, to at least one green sheet which is used to form the low oxygen region 1b, a powder, such as carbon, which is likely to react with oxygen in the ceramic green sheet is added.

In addition, an electrode material paste forming the electrostatic adsorbing electrode 2 and the heat generating resistor 3 is molded by printing on a ceramic green sheet forming the substrate 1. As the electrode material paste, for example, platinum (Pt) or W may be used. In this case, in order to place the electrostatic adsorbing electrode 2 in the low oxygen region 1b, a powder which is likely to react with oxygen in the ceramic green sheet during firing is provided around the electrode material paste forming the electrostatic adsorbing electrode 2. As the powder, for example, carbon may be used.

In this step, in order to form the electrostatic adsorbing electrode 2 and the heat generating resistor 3 at predetermined positions of the substrate 1, at least one ceramic green sheet on which the electrode material paste is not printed and at least one ceramic green sheet on which the electrode material paste is printed are laminated to each other. When the laminate thus obtained is fired at a predetermined temperature in a predetermined atmosphere, the substrate 1 in which the electrostatic adsorbing electrode 2 and the heat generating resistor 3 are embedded can be formed. In this case, the carbon powder provided around the electrostatic adsorbing electrode 2 is allowed to react with oxygen contained in the ceramic green sheet and generates CO, $CO_2$, or the like.

As a result, since the oxygen which reacts as described above is removed from the ceramic, a ceramic at an upper side of the electrostatic adsorbing electrode 2 can be formed into the low oxygen region 1b.

Example 1

In this example, a sample holder 10 in which an aluminum nitride ceramic is used for substrate 1 will be described. In this example, as shown in FIG. 2, a sample holder 10 including an electrostatic adsorbing electrode 2 as an electrical conductor will be described. First, an aluminum nitride powder having a particle diameter of 0.1 to 2 μm as a primary raw material and a sintering auxiliary agent in a minute amount were charged into a ball mill lined with a resin, such as a urethane or a nylon, and were then mixed and pulverized for 48 hours in a wet state together with a solvent, such as ion exchanged water or an organic solvent, and balls formed of a metal or a ceramic.

To a raw material slurry obtained by mixing and pulverizing as described above, an organic binder, such as a poly(vinyl alcohol), a poly(vinyl butyral), or an acrylic resin, a plasticizer, and a defoaming agent were added, and mixing was further performed for 3 hours. An organic-inorganic mixed slurry thus obtained was molded into ceramic green sheets having a thickness of 300 μm by a doctor blade method. In this step, to at least one green sheet which was used to form a low oxygen region 1c located in the vicinity of the electrostatic adsorbing electrode 2, a carbon powder which was likely to react with oxygen in the ceramic green sheet was added. In particular, as shown in Table 1, 0.2 percent by mass, 0.5 percent by mass, and 1.0 percent by mass of the carbon powder were added to Sample No. 1-2, Sample No. 1-3, and Sample No. 1-4, respectively. In addition, as a comparative example, Sample No. 1-1 to which no carbon powder was added was prepared.

After those green sheets were laminated to each other, firing was performed at a temperature of 2,000° C. in a hydrogen gas atmosphere. The substrate 1 was machined into a predetermined shape using a machining center, a rotary processing machine, or a cylindrical grinding machine. Furthermore, after the upper surface of the substrate 1 was processed to have a predetermined surface roughness, a groove was formed in the surface functioning as a sample holding surface 1a using a blast processing machine or the like, so that the sample holder 10 was formed.

The oxygen content and the dielectric tangent (tan δ) in the vicinity of the electrostatic adsorbing electrode 2 of each of those sample holders 10 were measured. The measurement of the oxygen content was performed by an oxygen/nitrogen/hydrogen analyzer (EMGA-930) manufactured by HORIBA. In addition, the measurement of the dielectric tangent was performed by a bridge circuit method. The results thereof are shown in Table 1.

TABLE 1

| No | Material | Carbon addition amount (mass %) | Oxygen content after firing (mass %) | tan δ (1 MHz) |
|---|---|---|---|---|
| 1-1* | AlN | 0 | 1.0 | 12 |
| 1-2 | AlN | 0.2 | 0.8 | 10 |
| 1-3 | AlN | 0.5 | 0.5 | 8 |
| 1-4 | AlN | 1.0 | 0.1 | 6 |

*indicates a comparative example.

When Sample Nos. 1-2, 1-3, and 1-4, which were the examples of the present invention, were compared to Sample No. 1-1, which was the comparative example, it was confirmed that in Sample Nos. 1-2, 1-3, and 1-4, the oxygen content was decreased in a region from a peripheral side surface of the electrode to a position approximately 100 μm apart therefrom. Furthermore, it was also confirmed that as the addition amount of carbon was increased, the oxygen content was decreased. In addition, as for Sample Nos. 1-2, 1-3, and 1-4, it was confirmed that the dielectric tangent was decreased.

Example 2

As another method for forming the low oxygen region 1c, a sample holder 10 in which a carbon layer having a thickness of 10 μm was provided on a surface of an electrode material paste forming the electrostatic adsorbing electrode 2 was formed. Except that the carbon particles were changed to the carbon layer, the sample holder 10 was formed by a method similar to that of Example 1. The electrostatic adsorbing electrode 2 was formed of W in Sample No. 2-2 which was an example of the present invention, and in Sample No. 2-4 which was also an example of the present invention, the electrostatic adsorbing electrode 2 was formed of Mo. In addition, as comparative examples, Sample No. 2-1 was formed so that the electrostatic adsorbing electrode 2 was formed of W, and no carbon layer was provided, and Sample No. 2-3 was formed so that the electrostatic adsorbing electrode 2 was formed of Mo, and no carbon layer was provided.

The oxygen content and the dielectric tangent in the vicinity of the electrostatic adsorbing electrode 2 of each of those sample holders 10 were measured. The results thereof are shown in Table 2.

TABLE 2

| No | Ceramic material | Electrode material | Carbon layer | Oxygen content after firing (mass %) | tan δ (1 MHz) |
|---|---|---|---|---|---|
| 2-1* | AlN | W | No | 1.0 | 12 |
| 2-2 | AlN | W | Yes | 0.7 | 9 |
| 2-3* | AlN | Mo | No | 0.8 | 10 |
| 2-4 | AlN | Mo | Yes | 0.6 | 7 |

*indicates a comparative example.

When Sample No. 2-2 was compared to Sample No. 2-1, it was confirmed that in Sample No. 2-2, the oxygen content was decreased in a region from a peripheral side surface of the electrode to a position approximately 100 μm apart therefrom. In addition, when Sample No. 2-4 was compared to Sample No. 2-3, it was confirmed that in Sample No. 2-4, the oxygen content was decreased in a region from a peripheral side surface of the electrode to a position approximately 100 μm apart therefrom. In addition, as for Sample Nos. 2-2 and 2-4, it was confirmed that the dielectric tangent was decreased.

Furthermore, after a silicon wafer was mounted on each of the samples of Examples 1 and 2 described above, a high frequency alternating current was allowed to pass through the electrostatic adsorbing electrode 2 of the sample holder 10, and the variation in temperature of the surface of the silicon wafer was measured.

TABLE 3

| No | Process temperature (° C.) | Applied RF (MHz) | Variation in temperature of wafer surface (° C.) |
|---|---|---|---|
| 1-1* | 300 | 13 | <20 |
| 1-1* | 300 | 40 | >40 |
| 1-1* | 300 | 80 | >60 |
| 1-2 | 300 | 13 | <20 |
| 1-2 | 300 | 40 | <30 |
| 1-3 | 300 | 40 | <20 |
| 1-4 | 300 | 40 | <20 |
| 1-4 | 300 | 80 | <40 |
| 2-2 | 300 | 40 | <20 |
| 2-4 | 300 | 40 | <20 |

*indicates a comparative example.

In Sample Nos. 1-2, 1-3, 1-4, 2-2, and 2-4, which were the examples of the present invention, it was confirmed that the variation in temperature was reduced. From the results described above, it was confirmed that in the sample holder 10 of the example of the present invention, the thermal uniformity of the sample holding surface 1a was improved.

REFERENCE SIGNS LIST

1 substrate
1a sample holding surface
1b low oxygen region
2 electrostatic adsorbing electrode
3 heat generating resistor
4 object to be adsorbed (sample)
10 sample holder

The invention claimed is:

1. A sample holder comprising: a substrate which is formed of a ceramic containing aluminum nitride as a primary component and which has an outer surface functioning as a sample holding surface; and an electrical conductor which is provided in the substrate and which faces the sample holding surface, wherein an oxygen content of the ceramic is small in a first region between the sample holding surface and the electrical conductor of the substrate wherein the first region is located inside a periphery of the electrical conductor as compared to that in a second region between the sample holding surface and the electrical conductor of the substrate wherein the second region is located outside the periphery of the electrical conductor, and the oxygen content is increased along a direction opposite to the electrical conductor.

2. The sample holder according to claim 1, wherein the electrical conductor is an electrostatic adsorbing electrode.

3. The sample holder according to claim 1, wherein the electrical conductor is a heat generating resistor, and the substrate further comprises an electrostatic adsorbing electrode provided between the sample holding surface and the heat generating resistor,
wherein the oxygen content of the ceramic is small in a third region between the sample holding surface and the electrostatic adsorbing electrode of the substrate wherein the third region is located inside a periphery of the electrostatic adsorbing electrode as compared to that in a fourth region between the sample holding surface and the electrostatic adsorbing electrode of the substrate wherein the fourth region is located outside the periphery of the electrostatic adsorbing electrode.

4. The sample holder according to claim 1, wherein a grain diameter of the ceramic located in an area of the electrical conductor is larger than the grain diameter of the ceramic located at the surface holding surface.

5. A sample holder comprising:
a substrate which is formed of a ceramic containing aluminum nitride as a primary component, the substrate comprising a sample holding surface, a first region disposed on a periphery of the substrate, and a second region that is disposed in the first region and comprises at least a part of the sample holding surface;
and an electrical conductor,
wherein an oxygen content of the ceramic in the second region is smaller than that in the first region,
wherein the electrical conductor is disposed in the second region and faces on the sample holding surface,
wherein the electrical conductor includes a first electrical conductor and a second electrical conductor,
wherein the first electrical conductor is disposed closer to the sample holding surface side than the second electrical conductor,
wherein the oxygen content of the second region is increased in a direction from the first electrical conductor to the sample holding surface.

6. The sample holder according to claim 5, wherein a grain diameter of the ceramic located in an area of the electrical conductor is larger than the grain diameter of the ceramic located at the sample holding surface.

7. A sample holder comprising:
a substrate which is formed of a ceramic containing aluminum nitride as a primary component, the substrate comprising a sample holding surface, a first region disposed on a periphery of the substrate, and a second region that is disposed in the first region and comprises at least a part of the sample holding surface;
and an electrical conductor,
wherein an oxygen content of the ceramic in the second region is smaller than that in the first region,
wherein the electrical conductor is disposed in the second region and faces on the sample holding surface, wherein a grain diameter of the ceramic located in an area of the electrical conductor is larger than the grain diameter of the ceramic located at the sample holding surface.

8. The sample holder according to the claim 7, wherein the electrical conductor includes a first electrical conductor and a second electrical conductor.

9. The sample holder according to the claim 8, wherein the first electrical conductor is disposed at closer to the sample holding surface side than the second electrical conductor.

\* \* \* \* \*